US007990293B2

(12) United States Patent
Luo

(10) Patent No.: US 7,990,293 B2
(45) Date of Patent: Aug. 2, 2011

(54) PROGRAMMABLE DESERIALIZER

(75) Inventor: Yan-Bin Luo, Taipei (TW)

(73) Assignee: MediaTek Inc., Science Based Industrial Park, Hsin-Chu (TW)

( * ) Notice: Subject to any disclaimer, the term of this patent is extended or adjusted under 35 U.S.C. 154(b) by 15 days.

(21) Appl. No.: 12/499,065

(22) Filed: Jul. 7, 2009

(65) Prior Publication Data

US 2011/0006932 A1 Jan. 13, 2011

(51) Int. Cl.
*H03M 9/00* (2006.01)
(52) U.S. Cl. ........................................ 341/100; 341/101
(58) Field of Classification Search .................. 341/100, 341/101; 375/368; 370/366
See application file for complete search history.

(56) References Cited

U.S. PATENT DOCUMENTS

| 6,097,323 | A | * | 8/2000 | Koga et al. | 341/100 |
| 7,626,523 | B2 | * | 12/2009 | Shin et al. | 341/101 |
| 7,684,763 | B2 | * | 3/2010 | Boos | 455/73 |

* cited by examiner

*Primary Examiner* — Joseph Lauture
(74) *Attorney, Agent, or Firm* — Winston Hsu; Scott Margo

(57) ABSTRACT

A deserializer for converting serial data into at least one parallel data includes a first flip-flop group, a second flip-flop group and a programmable frequency divider. The first flip-flop group includes a plurality of flip-flops connected in series, where the first flip-flop group is controlled by a first clock signal. The second flip-flop group includes a plurality of flip-flops, where the second flip-flop group is controlled by a second clock signal, and the flip-flops of the second flip-flop group are respectively connected to output nodes of the flip-flops of the first flip-flop group. The programmable frequency divider is coupled to each of the flip-flops of the second flip-flop group, and is utilized for receiving a control signal and generating the second clock signal by performing a frequency-dividing operation according to a frequency-dividing factor set by the control signal.

17 Claims, 5 Drawing Sheets

PROGRAMMABLE DESERIALIZER

BACKGROUND OF THE INVENTION

The present invention relates to a deserializer, and more particularly, to a deserializer capable of converting serial data into parallel data having different data rate.

A conventional 1-to-N deserializer is designed within a receiver and is used for converting high speed serial data into lower speed parallel data with N channels, and the factor "N" of the conventional 1-to-N deserializer is generally fixed. In other words, when the 1-to-N deserializer is designed and manufactured, the ratio between the data rate of the serial data and the data rate of the parallel data cannot be changed. For example, when serial data with 5 Gb/s is inputted into a 1-to-10 deserializer, the deserializer can only output ten parallel data with 500 Mb/s. Therefore, when the receiver needs to convert serial data with different data rate into parallel data with the same data rate, for example converting serial data with 5 Gb/s and 2.5 Gb/s into parallel data with 500 Mb/s, the receiver may include more deserializers to perform these converting operations. The manufacturing cost is therefore increased.

SUMMARY OF THE INVENTION

It is therefore an objective of the present invention to provide a deserializer capable of converting serial data into parallel data having different data rate, to solve the above-mentioned problems.

According to one embodiment of the present invention, a deserializer for converting serial data into at least one parallel data comprises a first flip-flop group, a second flip-flop group and a programmable frequency divider. The first flip-flop group comprises a plurality of flip-flops connected in series, where the first flip-flop group is controlled by a first clock signal. The second flip-flop group comprises a plurality of flip-flops, where the second flip-flop group is controlled by a second clock signal, and the flip-flops of the second flip-flop group are respectively connected to output nodes of the flip-flops of the first flip-flop group. The programmable frequency divider is coupled to each of the flip-flops of the second flip-flop group, and is utilized for receiving a control signal and generating the second clock signal by performing a frequency-dividing operation according to a frequency-dividing factor set by the control signal.

According to another embodiment of the present invention, a deserializer module for converting serial data into at least one set of parallel data comprises a 1-to-X deserializer, a plurality of programmable deserializer and a programmable frequency divider. The 1-to-X deserializer is utilized for receiving the serial data and generating a plurality of output data according to a first clock signal and a second clock signal, where a frequency of the first clock signal is X times a frequency of second clock signal; The plurality of programmable deserializer are respectively coupled to the 1-to-X deserializer, and each programmable deserializer comprises a first flip-flop group and a second flip-flop group, where the first flip-flop group comprises a plurality of flip-flops connected in series, the first flip-flop group is controlled by the second clock signal; and the second flip-flop group comprises a plurality of flip-flops, and the second flip-flop group is controlled by a third clock signal, and the flip-flops of the second flip-flop group are respectively connected to output nodes of the flip-flops of the first flip-flop group. The programmable frequency divider is utilized for receiving a control signal and generating the third clock signal by performing a frequency-dividing operation according to a frequency-dividing factor set by the control signal.

According to another embodiment of the present invention, a deserializer module for converting serial data into at least one set of parallel data comprises a first programmable deserializer, a second programmable deserializer, a first programmable frequency divider and a second programmable frequency divider. The first programmable deserializer is controlled by a first clock signal and a second clock signal. The plurality of second programmable deserializers are respectively coupled to the first programmable deserializer, and are controlled by the second clock signal and a third clock signal. The first programmable frequency divider is utilized for receiving a first control signal and generating the second clock signal by performing a frequency-dividing operation according to a first frequency-dividing factor set by the first control signal. The second programmable frequency divider is coupled to the second programmable deserializers, and is utilized for receiving a second control signal and generating the third clock signal by performing a frequency-dividing operation according to a second frequency-dividing factor set by the second control signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
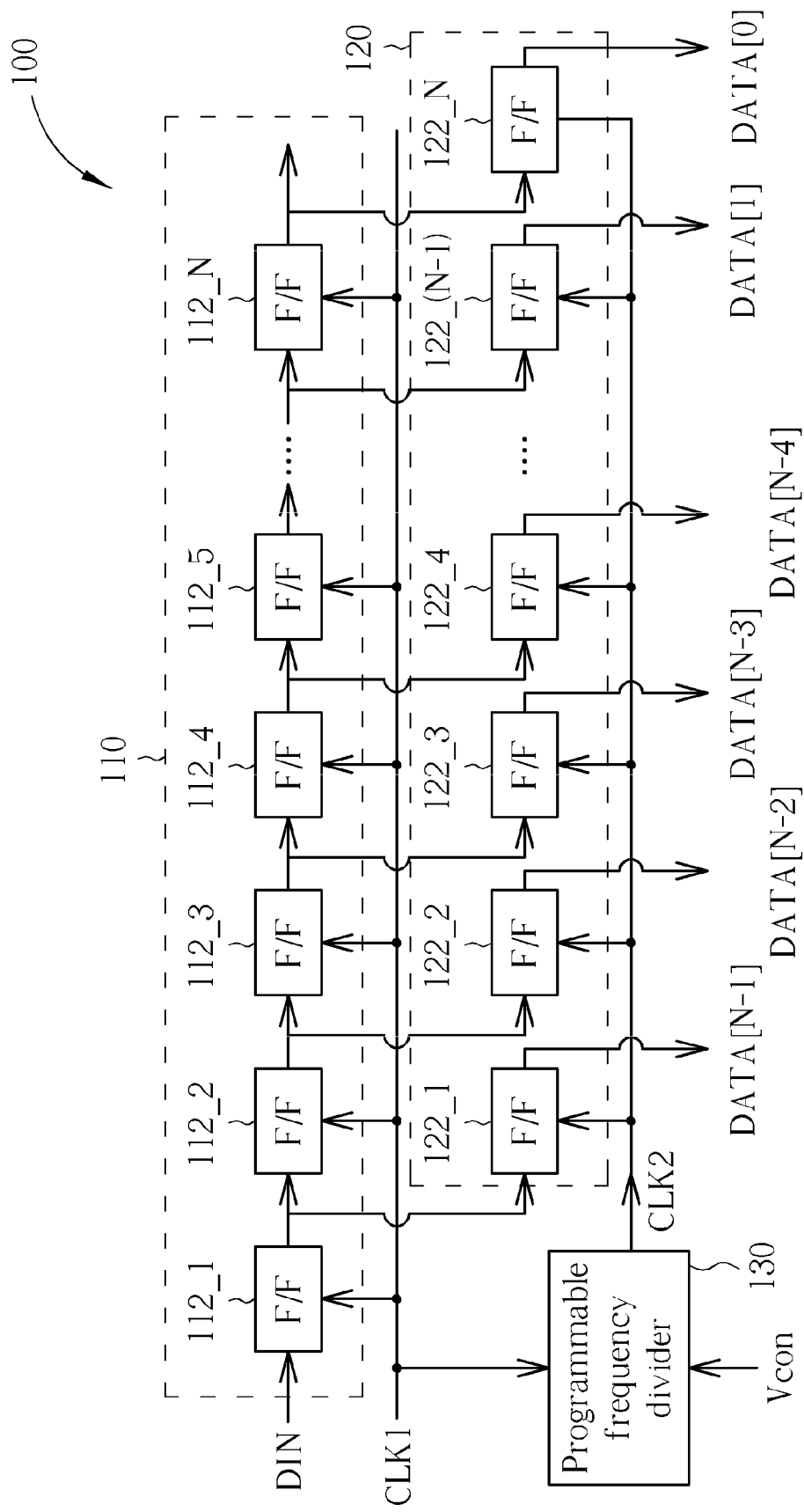
FIG. 1 is a diagram illustrating a programmable 1-to-M deserializer according one embodiment of the present invention.

Please refer to FIG. 1. FIG. 1 is a diagram illustrating a programmable 1-to-M deserializer 100 according one embodiment of the present invention. The deserializer 100 includes a first flip-flop group 110, a second flip-flop group 120 and a programmable frequency divider 130. The first flip-flop group 110 comprises several flip-flops 112_1-112_N connected in series, where the flip-flops 112_1-112_N are controlled by a first clock signal CLK1. The second flip-flop group 120 comprises several flip-flops 122_1-122_N, where the flip-flops 122_1-122_N are controlled by a second clock signal CLK2, and the flip-flops 122_1-122_N are respectively connected to output nodes of the flip-flops 112_1-112_N. The programmable frequency divider 130 is utilized for receiving a control signal Vcon and frequency-dividing the first clock signal CLK1 to generate the second clock signal CLK2 according to a frequency-dividing factor M set by the control signal Vcon. In addition, N channels are connected to the flip-flops 122_1-122_N to be utilized for receiving the outputs DATA[N−1], DATA[N−2], DATA[N−3], DATA[N−4], . . . , DATA[1], DATA[0] of the flip-flops 122_1-122_N, respectively.

In this embodiment, the frequency-dividing factor M can be set from 1 to N, where N is the quantity of the flip-flops of the second flip-flop group 120. For example, if a frequency of the first clock signal CLK is 5 Gb/s and N is equal to 10, the frequency-dividing factor M can be set from 1 to 10, thus a frequency of the second clock signal CLK2 generated from the programmable frequency divider 130 can be set as 5 Gb/s, 2.5 Gb/s, 1.667 Gb/s, 1.25 Gb/s, 1 Gb/s, . . . , or 0.5 Gb/s. However, the frequency-dividing factor M that can be set from 1 to N is merely an embodiment of the present invention, in other embodiments, the frequency-dividing factor M can be set from P to Q, where P and Q are integers less than N (e.g., P=2, Q=8 and N=10). This alternative design falls in the scope of the present invention.

Figure 2:
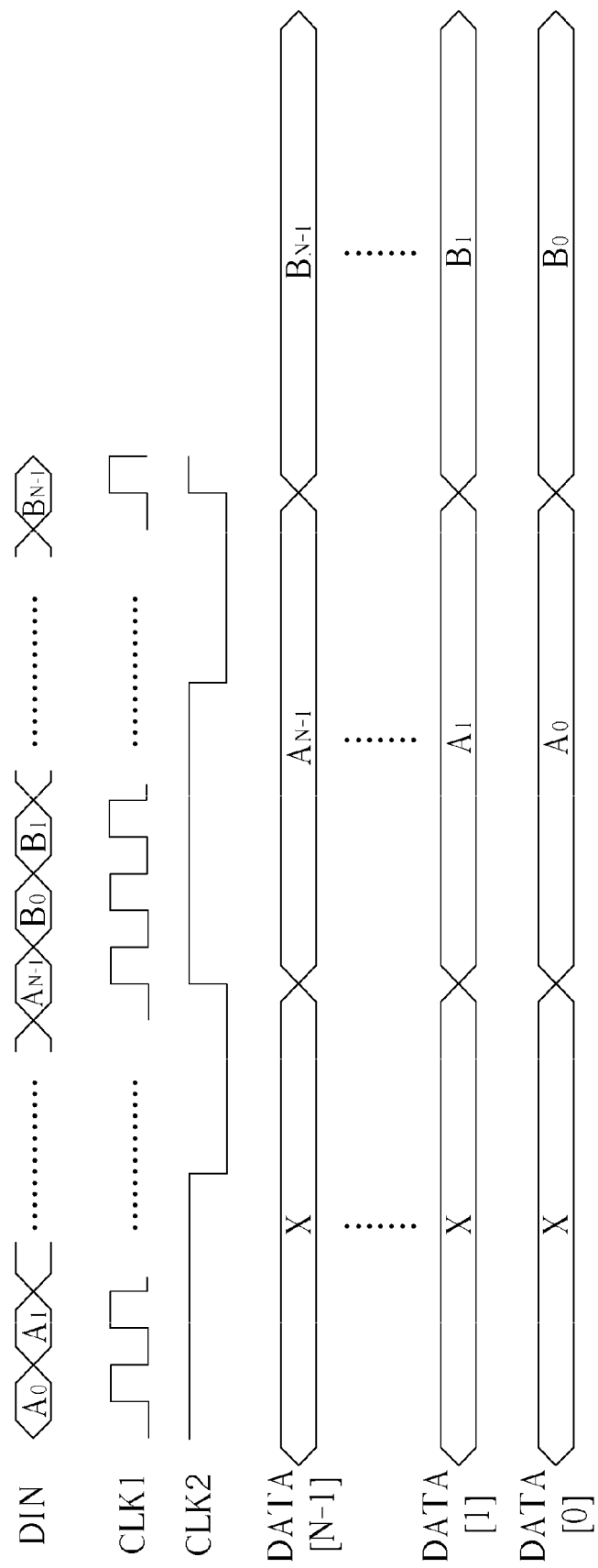
FIG. 2 is a timing diagram of the programmable 1-to-M deserializer shown in FIG. 1.

Please refer to FIG. 1 and FIG. 2 together. FIG. 2 is a timing diagram of the deserializer 100. Assuming that the frequency-dividing factor M of the programmable frequency divider 130 is set to be equal to N, in the operations of the deserializer 100, a serial data DIN is inputted into a first flip-flop group 110, where data $A_0, A_1, \ldots, A_{N-1}, B_0, B_1, \ldots, B_{N-1}$ are carried on the serial data DIN. When the data $A_0, A_1, \ldots, A_{N-1}$ are respectively buffered in the flip-flops 122_N-122_1 according to the first clock signal CLK1, the second clock signal CLK2 triggers the flip-flops 122_1-122_N to output the data $A_{N-1}, \ldots, A_1, A_0$, respectively. Then, the data $A_0, A_1, \ldots, A_{N-1}$ are respectively buffered in the flip-flops 122_N-122_1 according to the first clock signal CLK1, and the second clock signal CLK2 triggers the flip-flops 122_1-122_N to output the data $B_{N-1}, \ldots, B_1, B_0$, respectively.

Taking the frequency of the first clock signal CLK1=5 Gb/s and N=10 as an example, the frequency-dividing factor M of the programmable frequency divider 130 is equal to 10, and the frequency of the second clock signal CLK2 is equal to 500 Mb/s. The ten channels connected to the flip-flops 120_1-120_10 receive the parallel data DATA[9], DATA[8], . . . , DATA[1], DATA[0], respectively.

In the above case, the serial data has a data rate equal to 5 Gb/s and the parallel data has a required data rate equal to 500 Mb/s, therefore, the frequency-dividing factor M set by the control signal Vcon is equal to 10. However, if the deserializer 100 needs to receive serial data having a data rate equal to 2.5 Gb/s and still to output the parallel data having a data rate equal to 500 Mb/s, the frequency-dividing factor M can be set equal to 5 to output the correct parallel data. In the case that the frequency-dividing factor M is equal to 5, five parallel data DATA[4], DATA[3], DATA[2], DATA[1], DATA[0] having the data rate 500 Mb/s respectively outputted from the flip-flips 120_10, 120_9, . . . , 120_6 are utilized as the required output parallel data of the programmable 1-to-M deserializer 100, and the output of the other flip-flops 122_1-122_5 are ignored. It is noted that, utilizing the outputs from the flip-flips 120_10, 120_9, . . . , 120_6 as the required parallel data is one embodiment of the present invention. In other embodiments of the present invention, the required parallel data can be generated from any five adjacent flip-flops of the second flip-flop group 120.

Considering a "latency" issue, in one embodiment, the serial data DIN are inputted into the leading flip-flop 112_1 of the first flip-flop group 110, if the required parallel data has M channels, M flip-flops of the second flip-flop group 120 connected to first M flip-flops of the first flip-flop group 110 are utilized for outputting the parallel data, where M and N are integers, and N is greater than or equal to M. Taking M=5 and N=10 as an example, the required parallel data are generated from flip-flops 122_1-122_5.

Therefore, when a receiver needs to convert serial data with different data rate into parallel data with the same data rate, for example converting serial data with 5 Gb/s and 2.5 Gb/s into parallel data with 500 Mb/s, the receiver requires only one deserializer 100 of the present invention to perform these converting operations. That is, when the receiver needs to convert serial data with 5 Gb/s into parallel data with 500 Mb/s, the frequency-dividing factor M of the programmable frequency divider 130 is set equal to 10 to generate the second clock signal CLK2 having frequency equal to 500 Mb/s; when the receiver needs to convert serial data with 2.5 Gb/s into parallel data with 500 Mb/s, the frequency-dividing factor M of the programmable frequency divider 130 is set equal to 5 to generate the second clock signal having frequency equal to 500 Mb/s. Therefore, the manufacturing cost is decreased because only one deserializer is required.

Figure 3:
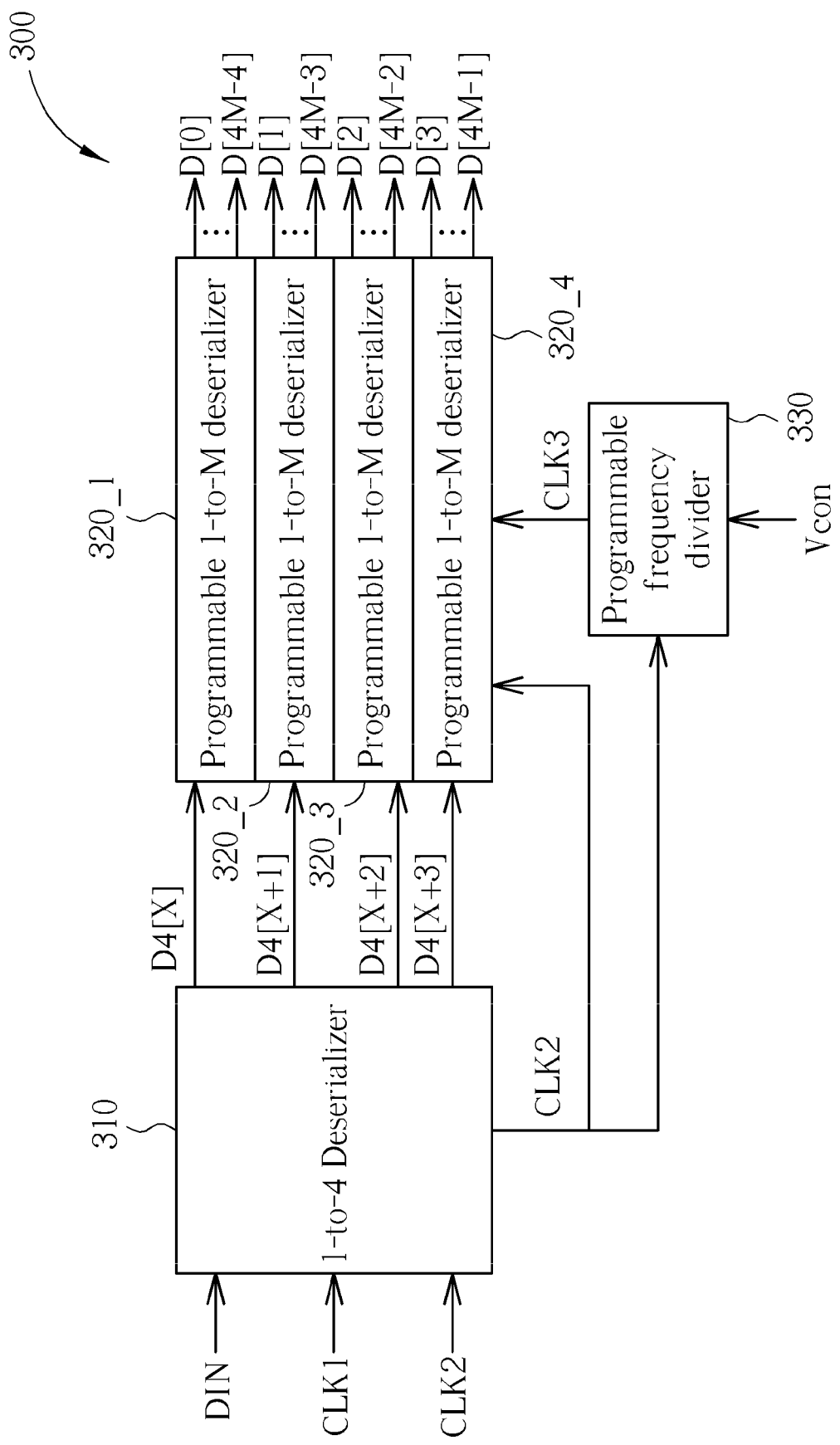
FIG. 3 is a programmable 1-to-4M deserializer module according to one embodiment of the present invention.

In addition, the programmable 1-to-M deserializer 100 can be used in a deserializer module to generate A*M parallel data. Please refer to FIG. 3. FIG. 3 is a programmable 1-to-4M deserializer module 300 according to one embodiment of the present invention. The deserializer module 300 includes a 1-to-4 deserializer 310, four programmable 1-to-M deserializers 320_1-320_4 and a programmable frequency divider 330. The 1-to-4 deserializer 310 can be any type of deserializer such as a well-known tree-type deserializer, multi-phase type deserializer or a shift register type deserializer, and is controlled by a first clock signal CLK1 and a second clock signal CLK2, where a frequency of the second clock signal CLK2 is a quarter of the frequency of the first clock signal CLK1. Each of the programmable 1-to-M deserializers 320_1-320_4 is implemented as the circuit of the first flip-flop group 110 and the second flip-flop group 120, and is controlled by the second clock signal CLK2 and a third clock signal CLK3, where a frequency of the third clock signal CLK3 is the frequency of the second clock signal CLK2 divided by a value M. The programmable frequency divider 330 is utilized for receiving a control signal Vcon, and utilized for frequency-dividing the first clock signal CLK1 to generate the second clock signal CLK2 according to a frequency-dividing factor M set by the control signal Vcon.

In the operations of the 1-to-4M deserializer module 300, the 1-to-4 deserializer 310 receives serial data DIN and generates four parallel data D[4X], D[4X+1], D[4X+2] and D[4X+3], and the programmable 1-to-M deserializers 320_1-320_4 respectively receive the parallel data D[4X], D[4X+1], D[4X+2] and D[4X+3] and output parallel data D[0], D[1], . . . , D[4M−1]. For example, if the frequency-dividing factor M is set equal to ten, there are forty parallel data outputted from the deserializer module 300; if the frequency-dividing factor M is set equal to five, there are twenty parallel data outputted from the deserializer module 300.

Figure 4:
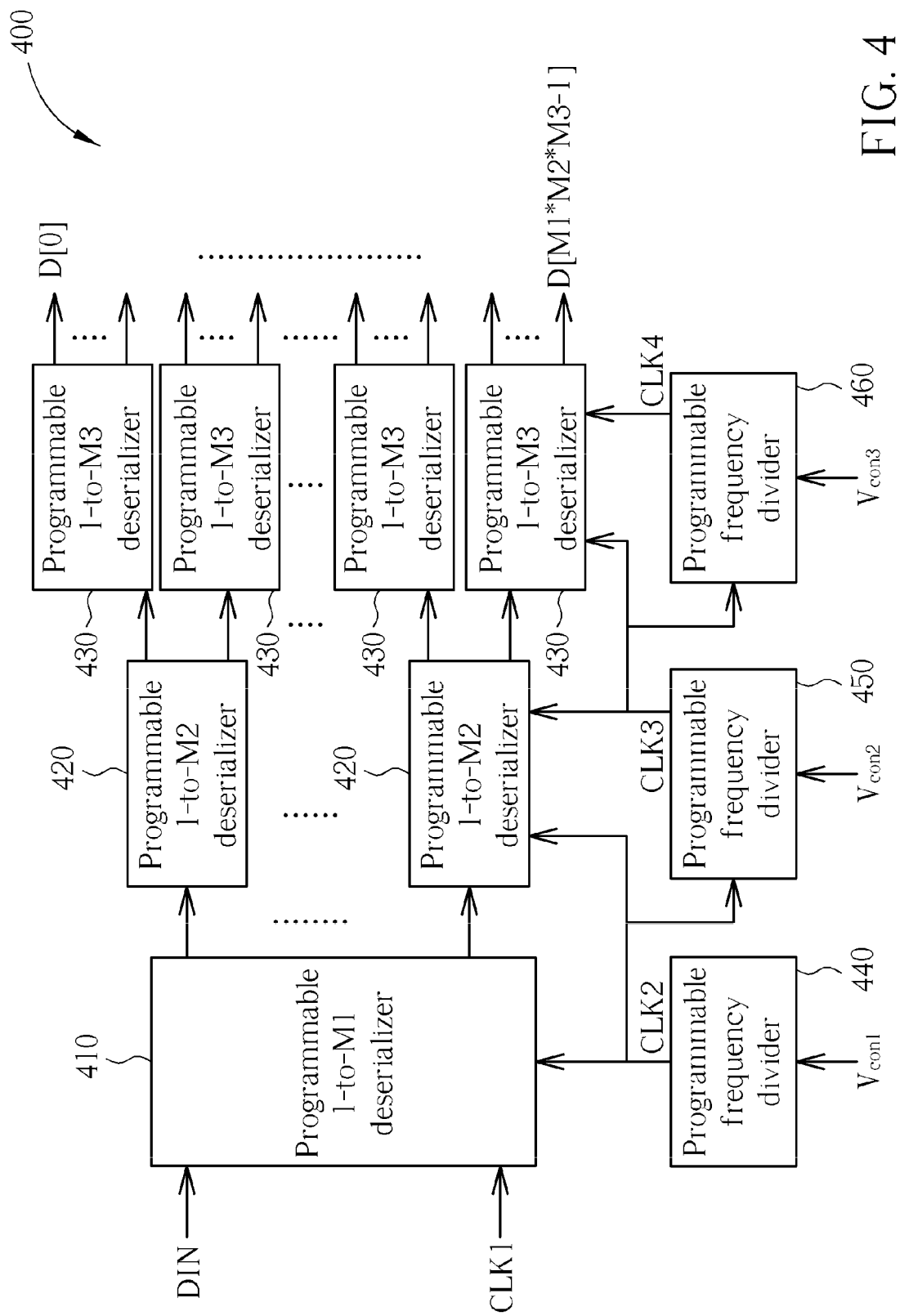
FIG. 4 is a programmable 1-to-M1*M2*M3 deserializer module according to one embodiment of the present invention.

Please refer to FIG. 4. FIG. 4 is a programmable 1-to-M1*M2*M3 deserializer module 400 according to one embodiment of the present invention. The deserializer module 400 includes a 1-to-M1 deserializer 410, a plurality of programmable 1-to-M2 deserializers 420, a plurality of programmable 1-to-M3 deserializers 430, and three programmable frequency divider 440, 450 and 460. The programmable 1-to-M1 deserializer 410 is implemented as the circuit of the first flip-flop group 110 and the second flip-flop group 120 shown in FIG. 1, and is controlled by a first clock signal CLK1 and a second clock signal CLK2. Each of the programmable 1-to-M2 deserializers 420 is implemented as the circuit of the first flip-flop group 110 and the second flip-flop group 120 shown in FIG. 1, and is controlled by the second clock signal CLK2 and a third clock signal CLK3. Each of the programmable 1-to-M3 deserializers 430 is also implemented as the circuit of the first flip-flop group 110 and the second flip-flop group 120 shown in FIG. 1, and is controlled by the third clock signal CLK3 and a fourth clock signal CLK4. The programmable frequency divider 440 is utilized for receiving a first control signal Vcon1 and frequency-dividing the first clock signal CLK1 to generate the second clock signal CLK2 according to a frequency-dividing factor M1 set by the first control signal Vcon1, that is, a frequency of the second clock signal CLK2 is a frequency of the first clock signal CLK1 divided by the frequency-dividing factor M1.

Similarly, the programmable frequency divider 450 is utilized for receiving a second control signal Vcon2 and frequency-dividing the second clock signal CLK2 to generate the third clock signal CLK3 according to a frequency-dividing factor M2 set by the second control signal Vcon2, and the programmable frequency divider 460 is utilized for receiving a third control signal Vcon3 and frequency-dividing the third clock signal CLK3 to generate the fourth clock signal CLK4 according to a frequency-dividing factor M3 set by the third control signal Vcon3.

In the operations of the 1-to-M1*M2*M3 deserializer module 400, the deserializer module 400 receives serial data DIN and generates parallel data D[0]-D[M1*M2*M3−1], and the value M1, M2 and M3 are all adjustable. For example, if the frequency-dividing factors M1, M2 and M3 are set to equal to 2, 4, 5, there are 40 (2*4*5=40) parallel data outputted from the deserializer module 400; if the frequency-dividing factors M1, M2 and M3 are set to be 2, 2, 4, respectively, there are 16 (2*2*4=16) parallel data outputted from the deserializer module 400.

Figure 5:
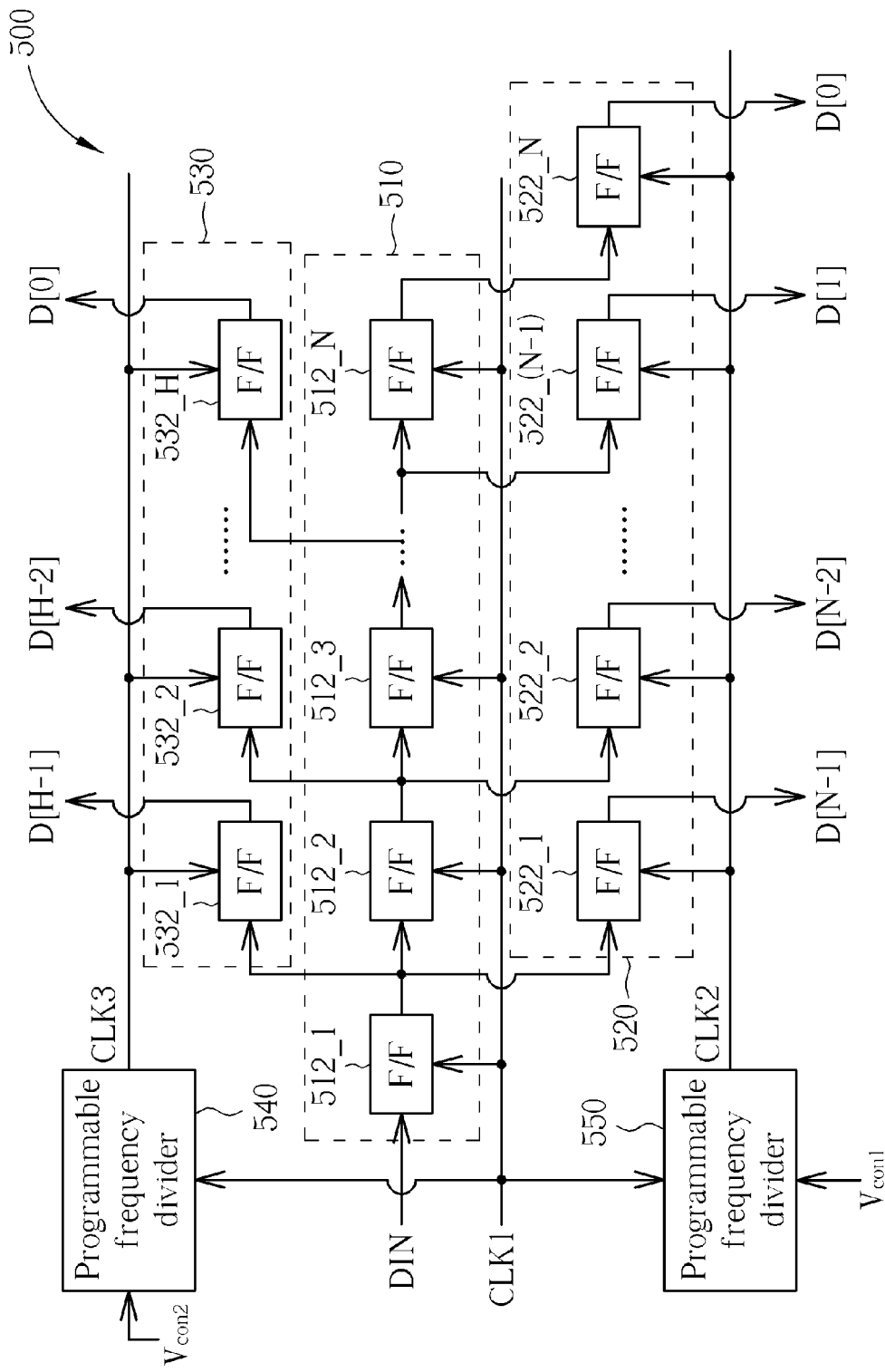
FIG. 5 is a diagram illustrating a programmable deserializer according one embodiment of the present invention

Please refer to FIG. 5. FIG. 5 is a diagram illustrating a programmable deserializer 500 according one embodiment of the present invention, where the deserializer 500 can receive one serial data and output two groups of parallel data. As shown in FIG. 5, the programmable deserializer 500 has a first flip-flop group 510, a second flip-flop group 520, a third flip-flop group 530, and two programmable frequency dividers 550 and 540. The first flip-flop group 510 comprises a plurality of flip-flops 512_1-512_N connected in series, where the flip-flops 512_1-512_N are controlled by a first clock signal CLK1. The second flip-flop group 120 comprises a plurality of flip-flops 522_1-522_N, where the flip-flops 522_1-522_N are controlled by a second clock signal CLK2. The third flip-flop group 520 comprises several flip-flops 532_1-532_H, where the flip-flops 532_1-532_H are controlled by a third clock signal CLK3. In addition, the flip-flops 522_1-522_N are respectively connected to output nodes of the flip-flops 512_1-512_N, and the flip-flops 532_1-532_H are respectively connected to output nodes of portion of the flip-flops 512_1-512_N. The programmable frequency divider 550 is utilized for receiving a first control signal Vcon1 and frequency-dividing the first clock signal CLK1 to generate the second clock signal CLK2 according to a frequency-dividing factor M set by the first control signal Vcon1, and the programmable frequency divider 540 is utilized for receiving a second control signal Vcon2 and frequency-dividing the first clock signal CLK1 to generate the third clock signal CLK3 according to a frequency-dividing factor K set by the second control signal Vcon2.

In addition, N channels are connected to the flip-flops 522_1-522_N, and are utilized for receiving the outputs D[N−1], D[N−2], . . . , D[1], D[0] of the flip-flops 522_1-522_N, respectively. H channels are connected to the flip-flops 532_1-532_H, and are utilized for receiving the outputs D[H−1], D[H−2], . . . , D[1], D[0] of the flip-flops 532_1-532_N, respectively.

In the deserializer 500, the frequency-dividing factor M of the programmable frequency divider 550 can be set from 1 to N, where N is quantity of the flip-flops of the second flip-flop group 520; and the frequency-dividing factor K of the programmable frequency divider 540 can be set from 1 to H, where H is quantity of the flip-flops of the third flip-flop group 530. However, in other embodiments, the frequency-dividing factor M can be set from P to Q, where P and Q are integers less than N (e.g., P=2, Q=8 and N=10), and frequency-dividing factor K can be set from R to S, where R and S are integers less than H (e.g., R=2, S=5 and H=8). These alternative designs fall in the scope of the present invention.

It is noted that, in the deserializer shown in FIG. 5, quantity of the flip-flips of the second flip-flop group 520 is greater than that of the third flip-flop group 530 (i.e., N is unequal to H). However, in other embodiments of the present invention, the quantity of the flip-flips of the second flip-flop group 520 can be equal to or less than that of the third flip-flop group 530. These alternative designs fall in the scope of the present invention.

In the operations of the deserializer 500, the deserializer 500 receives the serial data DIN and outputs two groups of parallel data, where one group of parallel data is outputted from a portion or all the flip-flops 522_1-522_N, and another group of parallel data is respectively outputted from the flip-flops 532_1-532_H. For example, assuming that the first clock signal CLK1=5 Gb/s, the frequency-dividing factor M of the programmable frequency divider 550 is equal to 5 and the frequency-dividing factor K of the programmable frequency divider 540 is equal to 2, a frequency of the second clock signal CLK2 is equal to 1 Gb/s and a frequency of the third clock signal CLK3 is equal to 2.5 Gb/s. Therefore, five parallel data D[0]-D[4] are outputted from the five adjacent flip-flops of the second flip-flop group 520, and two parallel data D[0] and D[1] are outputted from the two adjacent flip-flops of the third flip-flop group 530.

Briefly summarized, data rate of parallel data outputted from the programmable 1-to-M deserializer of the present invention is adjustable. Therefore, the programmable 1-to-M deserializer can adjust a frequency-dividing factor according to data rate of the input serial data to generate the required parallel data, and so has the flexibility to be applied in many applications.

Those skilled in the art will readily observe that numerous modifications and alterations of the device and method may be made while retaining the teachings of the invention.

What is claimed is:

1. A deserializer for converting serial data into at least one set of parallel data, comprising:
    a first flip-flop group, comprising a plurality of flip-flops connected in series, wherein the first flip-flop group is controlled by a first clock signal;
    a second flip-flop group, comprising a plurality of flip-flops, wherein the second flip-flop group is controlled by a second clock signal, and the flip-flops of the second flip-flop group are respectively connected to output nodes of the flip-flops of the first flip-flop group; and a first programmable frequency divider, coupled to each of the flip-flops of the second flip-flop group, for receiving a first control signal and generating the second clock signal by performing a frequency-dividing operation according to a first frequency-dividing factor set by the first control signal.

2. The deserializer of claim 1, wherein the first programmable frequency divider frequency-divides the first clock signal to generate the second clock signal.

3. The deserializer of claim 1, wherein the serial data are inputted into a leading flip-flop of the first flip-flop group, a number of the flip-flops of the second flip-flop group is equal to N, the parallel data has M channels, M flip-flops of the second flip-flop group connected to first M flip-flops of the first flip-flop group output the parallel data according to the second clock signal, N and M are integers, and N is greater than or equal to M.

4. The deserializer of claim 1, further comprising:
a third flip-flop group, comprising a plurality of flip-flops, wherein the third flip-flop group is controlled by a third clock signal, and the flip-flops of the third flip-flop group are respectively connected to portion or all the output nodes of the flip-flops of the first flip-flip group.

5. The deserializer of claim 4, further comprising:
a second programmable frequency divider, coupled to each of the flip-flops of the third flip-flop group, for receiving a second control signal and generating the third clock signal by performing a frequency-dividing operation according to a second frequency-dividing factor set by the second control signal.

6. The deserializer of claim 5, wherein the second programmable frequency divider frequency-divides the first clock signal to generate the third clock signal.

7. The deserializer of claim 5, wherein the deserializer is for converting the serial data into first parallel data and second parallel data, the serial data are inputted into a leading flip-flop of the first flip-flop group, a number of the flip-flops of the second flip-flop group is equal to N, the first parallel data has M channels and the second parallel data has K channels, M flip-flops of the second flip-flop group connected to first M flip-flops of the first flip-flop group output the first parallel data, K flip-flops of the third flip-flop group connected to first K flip-flops of the first flip-flop group output the second parallel data, M, N, and K are integers, and N is greater than or equal to either of M and K.

8. The deserializer of claim 7, wherein M is unequal to K.

9. A deserializer module for converting serial data into at least one set of parallel data, comprising:
a 1-to-X deserializer, for receiving the serial data and generating a plurality set of output data according to a first clock signal and a second clock signal, where a frequency of the first clock signal is X times a frequency of second clock signal;
a plurality of programmable deserializer respectively coupled to the 1-to-X deserializer, wherein each programmable deserializer comprises:
a first flip-flop group, comprising a plurality of flip-flops connected in series, wherein the first flip-flop group is controlled by the second clock signal; and
a second flip-flop group, comprising a plurality of flip-flops, wherein the second flip-flop group is controlled by a third clock signal, and the flip-flops of the second flip-flop group are respectively connected to output nodes of the flip-flops of the first flip-flop group;
wherein the deserializer module further comprises:
a programmable frequency divider, coupled to the plurality of programmable deserializers, for receiving a control signal and generating the third clock signal by performing a frequency-dividing operation according to a frequency-dividing factor set by the control signal.

10. The deserializer module of claim 9, wherein the programmable frequency divider frequency-divides the second clock signal to generate the third clock signal.

11. The deserializer module of claim 9, wherein for each programmable deserializer, one set of the output data of the 1-to-X deserializer is inputted into a leading flip-flop of the first flip-flop group, a number of the flip-flops of the second flip-flop group is equal to N, the parallel data has M channels, M flip-flops of the second flip-flop group connected to first M flip-flops of the first flip-flop group output the parallel data according to the second clock signal, N and M are integers, and N is greater than or equal to M.

12. A deserializer module for converting serial data into at least one set of parallel data, comprising:
a first programmable deserializer controlled by a first clock signal and a second clock signal;
a plurality of second programmable deserializers respectively coupled to the first programmable deserializer, and are controlled by the second clock signal and a third clock signal;
a first programmable frequency divider, coupled to the first programmable deserializer, for receiving a first control signal and generating the second clock signal by performing a frequency-dividing operation according to a first frequency-dividing factor set by the first control signal; and
a second programmable frequency divider, coupled to the second programmable deserializers, for receiving a second control signal and generating the third clock signal by performing a frequency-dividing operation according to a second frequency-dividing factor set by the second control signal.

13. The deserializer module of claim 12, wherein the first programmable deserializer comprises:
a first flip-flop group, comprising a plurality of flip-flops connected in series, wherein the first flip-flop group is controlled by the first clock signal; and
a second flip-flop group, comprising a plurality of flip-flops, wherein the second flip-flop group is controlled by the second clock signal, and the flip-flops of the second flip-flop group are respectively connected to output nodes of the flip-flops of the first flip-flop group.

14. The deserializer module of claim 13, wherein the serial data is inputted into a leading flip-flop of the first flip-flop group, a number of the flip-flops of the second flip-flop group is equal to N, the parallel data has M channels, M flip-flops of the second flip-flop group connected to first M flip-flops of the first flip-flop group output the parallel data according to the second clock signal, N and M are integers, and N is greater than or equal to M.

15. The deserializer module of claim 12, wherein each second programmable deserializer comprises:
a third flip-flop group, comprising a plurality of flip-flops connected in series, wherein the third flip-flop group is controlled by the second clock signal; and
a fourth flip-flop group, comprising a plurality of flip-flops, wherein the fourth flip-flop group is controlled by the third clock signal, and the flip-flops of the fourth flip-flop group are respectively connected to output nodes of the flip-flops of the third flip-flop group.

16. The deserializer module of claim 12, further comprising:
- a plurality of third programmable deserializers respectively coupled to the second programmable deserializers, and are controlled by the third clock signal and a fourth clock signal; and
- a third programmable frequency divider, coupled to the third programmable deserializers, for receiving a third control signal and generating the third clock signal by performing a frequency-dividing operation according to a third frequency-dividing factor set by the third control signal.

17. The deserializer module of claim 16, wherein each third programmable deserializer comprises:
- a fifth flip-flop group, comprising a plurality of flip-flops connected in series, wherein the fifth flip-flop group is controlled by the third clock signal; and
- a sixth flip-flop group, comprising a plurality of flip-flops, wherein the sixth flip-flop group is controlled by the fourth clock signal, and the flip-flops of the sixth flip-flop group are respectively connected to output nodes of the flip-flops of the fifth flip-flop group.

* * * * *